United States Patent
Matsunaga

(10) Patent No.: US 8,187,723 B2
(45) Date of Patent: May 29, 2012

(54) SURFACE-TREATED COPPER FOIL, MANUFACTURING METHOD OF THE SURFACE-TREATED COPPER FOIL, AND SURFACE-TREATED COPPER FOIL COATED WITH VERY THIN PRIMER RESIN LAYER

(75) Inventor: Tetsuhiro Matsunaga, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 167 days.

(21) Appl. No.: 11/915,038

(22) PCT Filed: Jun. 12, 2006

(86) PCT No.: PCT/JP2006/311744
§ 371 (c)(1),
(2), (4) Date: Feb. 20, 2008

(87) PCT Pub. No.: WO2006/134868
PCT Pub. Date: Dec. 21, 2006

(65) Prior Publication Data
US 2009/0029186 A1   Jan. 29, 2009

(30) Foreign Application Priority Data
Jun. 13, 2005   (JP) .................. 2005-173017

(51) Int. Cl.
*B05D 3/02*   (2006.01)
*B32B 15/04*   (2006.01)
*B32B 15/08*   (2006.01)
*B32B 15/092*   (2006.01)
*B32B 15/20*   (2006.01)

(52) U.S. Cl. ........ 428/626; 428/607; 428/624; 428/674; 428/675; 428/647; 428/648; 428/213; 428/215; 428/219; 428/220; 428/336; 428/340; 428/447; 427/386; 427/388.1; 427/388.5

(58) Field of Classification Search .................. 428/612, 428/607, 624, 626, 674, 675, 646, 647, 648, 428/212, 213, 214, 215, 219, 220, 332, 335, 428/334, 336, 340, 447, 448, 450, 457, 413, 428/414, 416, 418, 474.4, 477.7
See application file for complete search history.

(56) References Cited

U.S. PATENT DOCUMENTS
6,248,401 B1 *  6/2001   Chiang et al. ................ 427/96.8
(Continued)

FOREIGN PATENT DOCUMENTS
EP           0 637 902   *   2/1995
(Continued)

OTHER PUBLICATIONS
An English language abstract JP 7-170064, (Jul. 1995).
(Continued)

*Primary Examiner* — Michael Lavilla
(74) *Attorney, Agent, or Firm* — Greenblum & Bernstein, P.L.C.

(57) ABSTRACT

A surface-treated copper foil comprising an electrodeposited copper foil with a chromium-free rust-proofing layer which exhibits good performance in peel strength and resistance to peel loss after chemical treatment as a printed wiring board. The surface-treated copper foil comprises a rust-proofing layer and a silane coupling agent layer formed on an electrodeposited copper foil, wherein the rust-proofing layer comprises a nickel layer having a thickness by weight of 5 to 40 mg/m² and a tin layer having a thickness by weight of 5 to 40 mg/m² stacked in this order, and the silane coupling layer is applied on top of the tin layer. The surface-treated copper foil may be further coated with a very thin primer resin layer having a thickness of 0.5 to 5 μm.

9 Claims, 1 Drawing Sheet

U.S. PATENT DOCUMENTS

| | | | |
|---|---|---|---|
| 2001/0049027 A1* | 12/2001 | Endo et al. | 428/607 |
| 2002/0041032 A1 | 4/2002 | Yamamoto et al. | |
| 2002/0098374 A1* | 7/2002 | Fujiwara et al. | 428/607 |
| 2004/0157080 A1* | 8/2004 | Shinozaki | 428/606 |
| 2007/0243402 A1 | 10/2007 | Sato et al. | |

FOREIGN PATENT DOCUMENTS

| | | |
|---|---|---|
| JP | 7-170064 | 7/1995 |
| JP | 2002-67221 | 3/2002 |
| JP | 2004-47681 | 2/2004 |
| JP | 2005-053218 | 3/2005 |
| WO | WO 2005/009093 * | 1/2005 |

OTHER PUBLICATIONS

An English language abstract JP 2004-47681, (Feb. 2004).
An English language abstract JP 2005-053218. (Mar. 2005).
An English language abstract JP 2002-67221, (Mar. 2002).
U.S. Appl. No. 11/910,050 to Matsuda et al., filed Sep. 28, 2007.

* cited by examiner

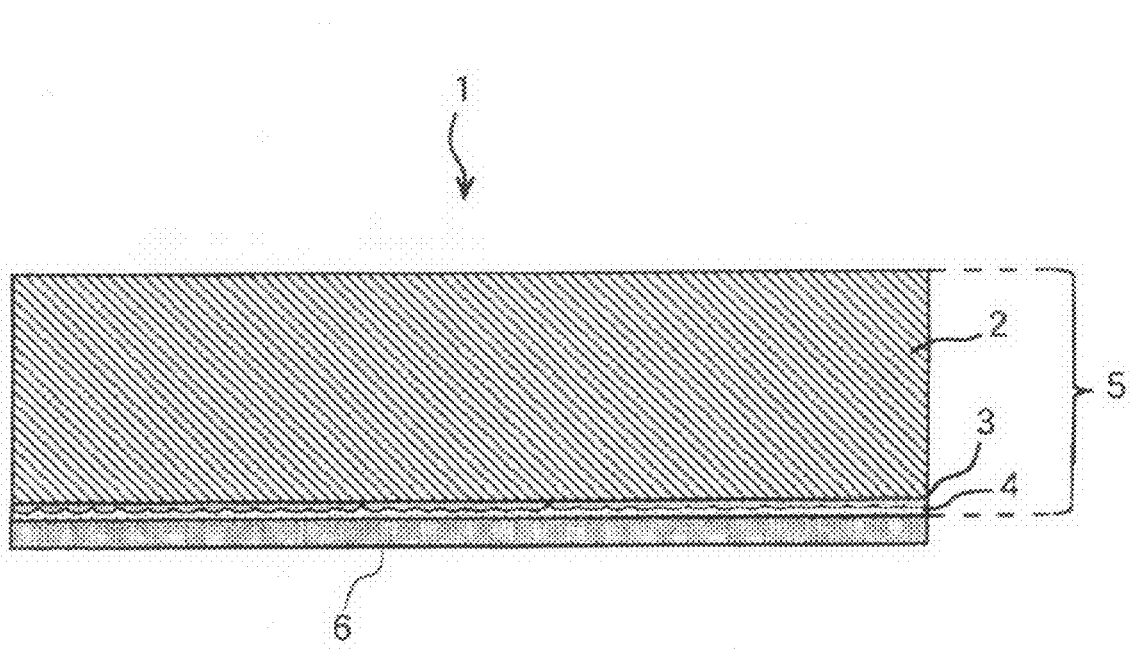

SURFACE-TREATED COPPER FOIL, MANUFACTURING METHOD OF THE SURFACE-TREATED COPPER FOIL, AND SURFACE-TREATED COPPER FOIL COATED WITH VERY THIN PRIMER RESIN LAYER

FIELD OF THE INVENTION

The present invention relates to a surface-treated copper foil and a manufacturing method of the surface-treated copper foil, and a surface-treated copper foil coated with a very thin primer resin layer. In particular, the present invention provides a surface-treated copper foil which shows good performance as a foil for printed wiring boards even without chromium for surface treatment, e.g., rust-proofing.

BACKGROUND ART

A chromium component has been widely used for an element in rust-proofing or surface modification of copper foils for printed wiring boards as plated chromium or treated chromate. Chromate treatment, in particular, has been applied for most of the commercial copper foils at present. A chromium component, when present in the form of chromium compound, is trivalent or hexavalent in terms of oxidation number. And hexavalent chromium is much more toxic in biological and easier to diffuse in the soil.

For these reasons, EU has adopted the ELV Directive forbidding use of environmental burden substances (lead, hexavalent chromium, mercury and cadmium) in new vehicles registered in the EU markets on and after Jul. 1, 2003. Together recommending positive use of trivalent chromium. Moreover, the EU's WEEE (Waste Electrical and Electronic Equipment) Directive and RoHS (Restriction on Hazardous Substances) Directive are finally agreed by the electric/electronic industries. These directives restrict use of a total of 6 substances including hexavalent chromium ($Cr^{6+}$) as the specific hazardous substances used in waste electric/electronic equipments which may include environmental risks, even when recovered separately from discarded electric/electronic devices, and printed wiring board is included in them.

On the other hand, transportation of hazardous wastes over country boundaries have been more noted worldwide since the 1970s. Since the beginning of the 1980s, the environmental pollution problems resulting from hazardous wastes transported from developed countries and left in developing countries caused environmental pollution more serious. As a result, "Basel Convention on the Control of Transboundary Movements of Hazardous Wastes and their Disposal" was adopted in which the international frameworks and procedures for restricting transboundary movements and the like of specific wastes was specified. It has been valid in Japan since 1993.

In addition, by increasing awareness of environmental issues, trivalent chromium may be converted into the hexavalent state with inadequate waste treatment, or it may be judged to be hexavalent by inadequate analytical procedures. In such background, applying of chromium free copper foils for printed wiring boards has been studied.

Patent Document 1 discloses idea on a metallic foil with an adhesion-promoting layer which contains at least one kind of silane coupling agent on at least one side which is characterized in chromium-free. And the disclosed chromium-free copper foil is also characterized in that the formed base metallic foil surface below the adhesion-promoting layer is neither roughened, nor coated with a zinc or chromium layer. The document also describes a metallic layer provided between the metallic foil surface and adhesion-promoting layer, the metallic layer containing a metal selected from the group consisting of indium, tin, nickel, cobalt, brass, bronze and a mixture of two or more of these metals, or from the group consisting of tin, chromium/zinc mixture, nickel, molybdenum, aluminum and a mixture of two or more of these metals.

Patent Document 2 discloses a copper foil for printed wiring board characterized in that a copper foil is coated with a metallic or alloy layer composed of at least one species of metal selected from the group consisting of nickel, molybdenum, cobalt and zinc, a coupling agent layer is formed on the metal or alloy layer, and an adhesion enhancing layer containing a linear polymer are applied in this order to provide an environment-friendly electrodeposited copper foil for printed wiring boards free from hazardous chromium.

Patent Document 1: Japan Patent Laid Open 07-170064
Patent Document 2: Japan Patent Laid Open 2004-47681

However, the invention disclosed in Patent Document 1 lacks in definitions judging from the whole description. So, it is unfortunately considered to be almost unrealizable except for those described in the embodiments. Moreover, it fails to realize a fully chromium-free copper foil, because applying of a combination of zinc and chromium for a stabilizer layer is described in the examples although it is aiming to provide a chromium-free copper foil.

Patent Document 2 discloses properties of a copper clad laminate, made of the copper foil for printed wiring boards and FR-5 grade prepreg (GEA-679N) in the table. The table describes peel strength and peel loss after hydrochloric acid dipping. However, circuit width to examine these properties is not clear. So, the present inventors have prepared the copper foil for tracing of the description of the document, and applying FR-4 grade prepreg which is most popularly used for manufacturing printed wiring boards to examine peel strength with fine circuits of 1 mm width or less. As a result, it was found that the copper foil is not suitable for fine-pitch circuits because peel loss after both hydrochloric acid dipping and moisture absorption is quite big.

As it is clear from above discussion, the layer containing such a metal is commonly referred to as a rust-proofing layer, a metallic component except copper applied on a copper foil performs to keep long-term shelf life by protecting copper foil from oxidation with ambient air. However, a rust-proofing layer may change performance of adhesion to a resin substrate depending on layer type. Especially after fabricating a printed wiring board, it affects on basic properties, peel strength, peel loss after both chemical treatments and moisture absorption, solder blister and the like.

Therefore, there are requirement on surface-treated copper foil without chromium in the rust-proofing layer which performs sufficient peel strength for wirings, less peel loss after both chemical treatments and moisture absorption and good solder blister after fabricating printed wiring board.

SUMMARY OF THE INVENTION

The present inventors have found out that an electrodeposited copper foil which adopts a tin layer for rust-proofing layer positively can achieve enough adhesion to a resin substrate and satisfy the basic properties required for a copper foil for printed wiring boards even without chromium-containing rust-proofing layer obtained by chromate treatment or the like.

Surface-Treated Copper Foil of the Present Invention:

Surface-treated copper foil of the present invention is the surface-treated copper foil comprising an rust-proofing layer and a silane coupling agent layer on the bonding surface of the electrodeposited copper foil to the insulating resin substrate, which is characterized in that the rust-proofing layer comprises a nickel layer having a thickness by weight of 5 to 40 mg/m$^2$ and a tin layer having a thickness by weight of 5 to 40 mg/m$^2$ stacked in this order, and the rust-proofing layer is provided with the silane coupling agent layer on the surface.

The rust-proofing layer of 2-layer structure of nickel and tin in the surface-treated copper foil of the present invention preferably has sum of nickel and tin in thickness by weight of 10 to 50 mg/m$^2$. It should also be noted that the deposited layers are non-alloyed nickel and non-alloyed tin layers, as further described in the deposition processes shown below.

Moreover, the rust-proofing layer of 2-layer structure of nickel and tin for the surface-treated copper foil of the present invention preferably has a [nickel weight]/[tin weight] ratio of ⅓ to 3.

If the electrodeposited copper foil comprises a roughening treatment on the surface to which the insulating resin substrate is bonded, physical anchoring effect to the resin substrate can be performed.

Moreover, the silane coupling agent used is any one of an amino-functional silane coupling agents and epoxy-functional silane coupling agents.

A Surface-Treated Copper Foil Coated with a Very Thin Primer Resin Layer of the Present Invention:

A surface-treated copper foil coated with a very thin primer resin layer is characterized in that the bonding surface of the surface-treated copper foil to the insulating resin substrate comprises a very thin primer resin layer having a thickness by calculation of 0.5 to 5-micron meter.

The very thin primer resin layer is preferably composed of a resin composition comprising 5 to 80 parts by weight of an epoxy resin (including a curing agent), 20 to 95 parts by weight of a solvent-soluble aromatic polyamide resin or polyether sulfone and, as required, a curing accelerator added in an appropriate amount.

The aromatic polyamide resin used for the very thin primer resin layer is preferably prepared by reacting an aromatic polyamide with a rubber-like resin.

The resin composition which constitutes the primer resin layer of the surface-treated copper foil coated with very thin primer resin layer of the present invention preferably has a resin flow of 5% or less, examined in accordance with the MIL specification (MIL-P-13949G).

Manufacturing Method of the Surface-Treated Copper Foil of the Present Invention:

The manufacturing method of the surface-treated copper foil of the present invention comprises forming a nickel layer on the bonding surface of an electrodeposited copper foil to an insulating resin substrate followed by forming a tin layer on the nickel layer to be a rust-proofing layer, and adsorbing a silane coupling agent on the surface of the tin layer and drying the silane coupling agent to form a silane coupling agent layer, wherein the nickel layer is preferably formed by using the nickel electrolytic solution and the electrolysis conditions as following.

Nickel electrolytic solution:
　　$NiSO_4 \cdot 6H_2O$ concentration: 1 to 10 g/L (as nickel) $K_4P_2O_7$ concentration: 50 to 400 g/L Electrolysis conditions:
　　Solution temperature: 20 to 50° C.
　　pH: 9 to 12
　　Current density: 0.1 to 2.5 A/dm$^2$
　　Stirring: Done The tin layer forming in manufacturing method of the surface-treated copper foil of the present invention is preferably formed by using the tin electrolytic solution and the electrolysis conditions as following.

Tin electrolytic solution:
　　$K_2SnO_3 \cdot 3H_2O$ concentration: 1 to 10 g/L (as tin)
　　$K_4P_2O_7$ concentration: 50 to 400 g/L Electrolysis conditions:
　　Solution temperature: 20 to 45° C.
　　pH: 10 to 13
　　Current density: 0.1 to 2.0 A/dm$^2$ The silane coupling agent layer for production of the surface-treated copper foil of the present invention is preferably formed by adsorbing a silane coupling agent solution comprising amino-functional silane coupling agent or epoxy-functional silane coupling agent in water or an organic solvent at a concentration of 1 to 10 g/L on the surface of the tin layer and dried.

The drying in the manufacturing method of the surface-treated copper foil of the present invention is preferable to be carried out in an atmosphere with temperature at 160 to 200° C.

It is more preferable that the drying is carried out for 30 to 240 minutes in an atmosphere with temperature at 180 to 190° C. to perform a baking effect with a drying.

Manufacturing Method of the Surface-Treated Copper Foil Coated with a Very Thin Primer Resin Layer of the Present Invention:

The manufacturing method of the surface-treated copper foil coated with a very thin primer resin layer of the present invention is characterized in that the resin solution for forming a very thin resin layer is prepared according to the procedure, Step a followed by Step b, and the resin solution is coated on the surface of the copper foil on which the silane coupling agent layer is formed to be a thickness by calculation of 0.5 to 5-micron meter; and drying the resin solution to be a semi-cured state.

Step a: preparation of a resin composition as a mixture comprising 5 to 80 parts by weight of an epoxy resin (including a curing agent), 20 to 95 parts by weight of a solvent-soluble aromatic polyamide resin or polyethersulfone and, as required, a curing accelerator added in an appropriate amount; and Step b: dissolving of the resin composition in an organic solvent to prepare a resin solution with solid resin content of 10 to 40% by weight.

ADVANTAGES OF THE INVENTION

The surface-treated copper foil of the present invention has a state in a rust-proofing layer stacking a nickel layer and tin layer in this order. The surface-treated copper foil with such rust-proofing layer can satisfy the basic properties after formation of the printed wiring boards, peel strength and less peel loss after both chemical treatment and moisture absorption, and good solder blister of the circuit, even without chromium in the rust-proofing layer. The surface-treated copper foil of the present invention performs even or better properties than those of a conventional chromate-treated copper foil. The rust-proofing layer of the present invention which is described just rust-proofing layer in this specification, improves adhesion of the foil to the resin substrate, peel strength, resistance to chemicals and so forth.

Moreover, the rust-proofing layer on the surface-treated copper foil of the present invention performs good adhesion to a resin substrate, even when the foil surface on the bonding side has no roughening treatment for an anchor effect. In particular, the surface-treated copper foil can be well secured in adhesion to an insulating resin substrate, when it is coated with a very thin primer layer having a thickness by calculation of 0.5 to 5-micron meter on the bonding side.

The surface-treated copper foil of the present invention has a rust-proofing layer comprising a nickel layer and tin layer in this order. Therefore, nickel layer and tin layer can be formed by independent plating process. So, a nickel/tin alloy plating solution for nickel-tin alloy plating which lacks solution stability may not be used and management cost as a result of complicated process management procedure may not increase.

BRIEF DESCRIPTION OF THE DRAWING

FIG. 1 is a schematic cross-sectional view illustrating a surface treated copper foil coated with a very thin primer resin layer of the present invention.

REFERENCE NUMERALS

1 Surface treated copper Foil Coated With Very Thin Primer Resin Layer
2 Copper Foil
3 Rust-proofing Layer
4 Silane Coupling Agent Layer
5 Surface Treated Copper Foil
6 Very Thin Primer Resin Layer

DETAILED DESCRIPTION OF THE PREFERABLE EMBODIMENTS

The preferred embodiments for the surface-treated copper foil, manufacturing method of the surface-treated copper foil and surface-treated copper foil coated with a very thin primer resin layer of the present invention will be described.
<Surface-Treated Copper Foil of the Present Invention>

The surface-treated copper foil of the present invention is the surface-treated copper foil comprising a rust-proofing layer and a silane coupling agent layer on the bonding surface of the electrodeposited copper foil to the insulating resin substrate, wherein the rust-proofing layer comprises a nickel layer having a thickness by weight of 5 to 40 mg/m² and a tin layer having a thickness by weight of 5 to 40 mg/m² stacked in this order, and the silane coupling agent layer is provided on the surface of the rust-proofing layer.

The surface-treated electrodeposited copper foil is characterized by use of a tin layer for rust-proofing layer. The tin layer is provided as the outermost layer of the rust-proofing layer. Then a silane coupling agent layer is formed on the tin layer as described later. A combination of the tin layer with the silane coupling agent layer is highly active to result excellent adsorption of silane coupling agent and secures stable formation of the silane coupling agent layer. Moreover, the tin layer as the outermost layer of the rust-proofing layer secures the adhesion of surface-treated electrodeposited copper foil to the resin substrate, and improves peel loss after both hydrochloric acid dipping and moisture absorption, as described later.

But, just the tin layer on the copper foil may thermally diffuse within bulk copper in the surface-treated electrodeposited copper foil when it is heated, e.g., when drying and heating in the surface-treated copper foil production process and heating in processing a printed wiring board. As a result, it may cause quality deviations, so nickel layer is formed to perform as a barrier layer for diffusion. Therefore, adopting a combination of the tin and nickel layers as the rust-proofing layer can secures excellent adhesion with resin substrate and, at the same time, improves heat resistance even without chromium component for the rust-proofing layer.

Applying the rust-proofing layer of 2-layer composed of nickel layer and tin layer structure is excellent in production stability and control of the layer thickness because nickel layer and tin layer are individually formed. It enables to adjust its composition for specific purposes freely, e.g., aiming a high etching factor or migration resistance.

To ease understanding of the description, an electrodeposited copper foil is described on which surface-treatment will be performed. Any base copper foil before forming a rust-proofing layer is named as electrodeposited copper foil in this specification hereinafter. So, a concept of the electrodeposited copper foil includes both electrodeposited copper foil with or without roughening treatment and any type can be used according to specific purposes. For the roughening treatment here, whether putting of fine metallic particles or etching on the surface of un-treated foil obtained by electrolysis of a copper electrolytic solution is applied. Roughening treatment of the foil surface on the bonding side to result surface irregularities performs physically anchoring effect to the resin substrate.

The method for forming former described fine metallic particles in which fine copper particles are put on a matte side will be described. The roughening treatment comprises two steps, the first step for depositing fine copper particles on a matte side, and second step for seal plating to prevent dropping off of the particles from the surface.

In the first step for depositing fine copper particles on a matte side, burning plating conditions are applied. So, the concentration of plating solution for forming fine copper particles is relatively lower to perform burning plating conditions. The plating condition is not especially limited and can be applied in consideration of production line characteristics. With a copper sulfate base solution, for example, concentrations of copper at 5 to 20 g/L, sulfuric acid at 50 to 200 g/L with one or more additives as required (e.g., alpha-naphthoquinoline, dextrin, glue, thiourea or the like) is prepared and plating conditions with solution temperature of 15 to 40° C. and current density of 10 to 50 A/dm².

The seal plating step is a process to deposit copper even to seal fine copper particles under even plating conditions to prevent dropping off of the fine copper particles deposited. So, the solution used for forming the bulk copper layer may be used in this step as the copper ion source. The even plating condition is not especially limited and can be applied in consideration of production line characteristics. With a copper sulfate base solution, for example, concentrations of copper at 50 to 80 g/L and sulfuric acid at 50 to 150 g/L is prepared and plating conditions with solution temperature of 40 to 50° C. and current density of 10 to 50 A/m². Thus, roughening treatment on the surface of electrodeposited copper foil (untreated foil) is performed.

Next, nickel layer which constitutes the rust-proofing layer has a thickness by weight of 5 to 40 mg/m² (observed thickness: 1.3 to 10.4 nm). The layer having a thickness by weight under 5 mg/m² may not work well as a barrier layer so meaningless. On the other hand, layer thickness thicker than 40 mg/m² for nickel layer is not necessary in consideration of heating energy generally applied in printed wiring board production. But nickel layer can be made to be thicker than 40 mg/m². Nickel layer can be removed with an etchant which selectively dissolves nickel without etching the copper afterwards even when nickel layer remains on the substrate after the copper etching step is over. So it may cause no problem in printed wiring board production process without economic consideration. The thickness by weight represented by the unit mg/m² is calculated value as the metal amount per unit area (1 m²), after analyzing the solution in which the rust-proofing layer of the surface-treated copper foil in 5 by 5 cm is completely dissolved in an acidic solution by an ICP analyzer. The observed thickness is obtained from examination on the metal profile in the thickness direction analyzed by a GDS analyzer.

The tin layer formed on the nickel layer has a thickness by weight of 5 to 40 mg/m² (observed thickness: 1.3 to 10.4 nm). Combination of the tin layer with the silane coupling agent layer described later can secure the adhesion with resin substrate. The layer having a thickness by weight under 5 mg/m² may result poor resistance to chemicals, moisture and the like even when combined with any silane coupling agent layer, although keeping good peel strength as received because of the anchoring effect caused by the roughening treatment. In particular, it is difficult to result a uniform thickness in nanometer order for the tin layer when formed by electrodeposition, but to perform desired properties, thickness by weight of 5 mg/m² is enough. On the other hand, tin layer having a thickness by weight over 40 mg/m² may be too thick to remove by etching in the printed wiring board production process.

The rust-proofing layer of 2-layer structure with nickel and tin for the surface-treated copper foil of the present invention, the rust-proofing layer preferably has sum of thickness by weight of nickel and tin of 10 to 50 mg/m². The sum thickness is the total thickness of the rust-proofing layer. When the rust-proofing layer having a sum thickness by weight over 50 mg/m², dissolving such a thick rust-proofing layer in an acidic etchant, e.g., copper or iron chloride etching solution or the like, the metallic component of nickel or tin tends to remain as etching residue between patterned circuits. It may results short circuit caused by deposition of metals between circuits by electroless plating performed afterwards or surface migration in the circuit operation. When it is etched by an alkaline etchant, an undesirable phenomenon known as blackening tends to occur. The rust-proofing layer having a sum thickness by weight under 10 mg/m² means that both of the nickel and tin layer is thinner than 5 mg/m². It may result greatly poor rust-proofing performance and lose long-term shelf life. It means that the copper foil may not keep sufficient properties which the present invention is aiming to have as a chromium-free electronic material. Moreover, the sum thickness by weight is preferably 15 to 45 mg/m². The rust-proofing layer having a sum thickness by weight in the above range assures both complete etching out of rust-proofing layer fully and sufficient rust-proofing performance. As a result, it allows the copper foil to be most stabile in overall properties as a chromium-free electronic material.

In addition, the rust-proofing layer of 2-layer structure of nickel and tin in the surface-treated copper foil of the present invention, the rust-proofing layer preferably has a ratio [thickness by weight of nickel]/[thickness by weight of tin] of ⅓ to 3. With the ratio of the thickness by weight under ⅓, the nickel layer may result an insufficient thickness relative to the tin layer. It may results poor properties, e.g., peel strength, when it is pressed to the substrate and then heated at around 180° C. for 60 minutes. On the other hand, with the ratio of thickness by weight over 3, nickel amount in the rust-proofing layer increase because nickel amount increase against to tin amount. It may cause difficulties in adsorbing of a silane coupling agent layer to the rust-proofing layer and results difficulties in performing the functions of the silane coupling agent layer as an adhesion promoter. More preferable ratio [thickness by weight of nickel]/[thickness by weight of tin] is in a range from ½ to 2. Because it can make properties greatly stabile, e.g., peel strength after pressing to substrate and then heated as described above and adsorption of a silane coupling agent stable also, even when it is produced in a production line with fluctuation. It is needless to say that the rust-proofing layer includes a layer which is contaminated with invariably present impurities, so long as it exhibits the similar functions/effects realized based on the technical concept of the present invention. Moreover, the rust-proofing layer may include a highly soluble component to a copper etchant, e.g., zinc, at an adequate content to improve solubility of the nickel and tin layers, so long as the similar functions/effects are kept.

Strictly speaking, the rust-proofing layer composed of the nickel and tin layers for the surface-treated copper foil of the present invention is preferably provided on the other side of the foil. In this case, the rust-proofing layer provided on the other side preferably include zinc to perform advantages, assuring long-term shelf life, preventing oxidation during the pressing and assuring preferable black-oxide treatment.

The silane coupling agent layer can be provided by using silane coupling agents, e.g., epoxy-functional, amino-functional, methacryloxy-functional or mercapt-functional one. These agents may be used either individually or in combination of two or more. Of these, an amino-functional or epoxy-functional silane coupling agent is more preferable.

The amino-functional silane coupling agents include those of amino-functional silane coupling agents selected from followings. N-(2-aminoethyl)-3-aminopropyl trimethoxysilane, 3-(N-styrylmethyl-2-aminoethylamino) propyl trimethoxysilane, 3-aminopropyl triethoxysilane, bis(2-hydroxyethyl)-3-aminopropyl triethoxysilane, aminopropyl trimethoxysilane, N-methylaminopropyl trimethoxysilane, N-phenylaminopropyl trimethoxysilane, N-(3-acryloxy-2-hydroxypropyl)-3-aminopropyl triethoxysilane, 4-aminobutyl triethoxysilane, (aminoethylaminomethyl)phenethyl trimethoxysilane, N-(2-aminoethyl-3-aminopropyl) trimethoxysilane, N-(2-aminoethyl-3-aminopropyl) tris(2-ethylhexoxy)silane, 6-(aminohexylaminopropyl) trimethoxysilane, aminophenyl trimethoxysilane, 3-(1-aminopropoxy)-3,3-dimethyl-1-propenyl trimethoxysilane, 3-aminopropyl tris(methoxyethoxyethoxy) silane, 3-aminopropyl triethoxysilane, 3-aminopropyl trimethoxysilane, omega-aminoundecyl trimethoxysilane, 3-(2-N-benzylaminoethylaminopropyl) trimethoxysilane, bis(2-hydroxyethyl)-3-aminopropyl triethoxysilane, (N,N-diethyl-3-aminopropyl) trimethoxysilane, (N,N-dimethyl-3-aminopropyl) trimethoxysilane, N-methylaminopropyl) trimethoxysilane, N-phenylaminopropyl trimethoxysilane and 3-(N-styrylmethyl-2-aminoethylamino)propyl trimethoxysilane.

The silane coupling agent layer is provided with a thickness by weight of 0.15 to 20 mg/m² as atomic silicon, preferably of 0.3 to 2.0 mg/m². The silane coupling agent layer having a thickness by weight under 0.15 mg/m² as atomic silicon may not improve adhesion of the surface-treated copper foil to the resin substrate. It is possible to increase the thickness by weight over 20 mg/m² as atomic silicon, but it may not improve adhesion any more with increased silane coupling agent layer.

<Manufacturing Method of the Surface-Treated Copper Foil of the Present Invention>

The manufacturing method of the surface-treated copper foil of the present invention in which a nickel and tin layers are formed in this order on the bonding side of an electrodeposited copper foil (including that composed of a roughening treatment). And then a silane coupling agent layer is adsorbed on the tin layer followed by drying to form a silane coupling agent layer. The manufacturing method of the surface-treated copper foil is characterized in that the nickel layer is formed by using the following nickel-containing electrolytic solution and under the following electrolysis conditions.

A nickel-containing electrolytic solution for the manufacturing method of the surface-treated copper foil of the present invention, solution selected from widely used popular nickel plating solutions can be used. For example, they include: i) a nickel sulfate solution containing nickel in the concentration of 5 to 30 g/L is used under conditions of solution temperature of 20 to 50° C., pH of 2 to 4 and current density of 0.3 to 10 A/dm$^2$; ii) a nickel sulfate solution containing in the concentration of 1 to 10 g/L and potassium pyrophosphate in the concentration of 50 to 400 g/L is used under conditions of solution temperature of 20 to 50° C., pH of 9 to 12 and current density of 0.1 to 2.5 A/dm$^2$; and iii) a nickel sulfate solution containing nickel in the concentration of 10 to 70 g/L and boric acid in the concentration of 20 to 60 g/L is used under conditions of solution temperature of 20 to 50° C., pH of 2 to 4 and current density of 1 to 50 A/dm$^2$. Other conditions may be applied by selecting from those for Watt baths.

Of these, it is more preferable to use a solution containing $NiSO_4 \cdot 6H_2O$ and $K_4P_2O_7$ (potassium pyrophosphate). In which $NiSO_4 6H_2O$ is preferably contained in the concentration of 1 to 10 g/L (as nickel). With the nickel concentration of under 1 g/L, nickel concentration is too dilute to result poor current efficiency and fail to satisfy industrial productivity. Moreover, it results poor cosmetic appearance due to generation of gases to give poor smoothness to a plated surface of the nickel layer. On the other hand, with the nickel concentration of over 10 g/L, nickel may not be electroplated uniformly, because of decreased ratio of the nickel ion to a complex forming component (so-called P ratio).

Solution temperature may be applied in a wide range from 20 to 50° C. Because the mechanical properties has less relationship to solution temperature, unlike one commonly used in a bath, e.g., nickel acetate or sulfamic acid. The solution of the above composition at a pH of 9 to 12 gives a plated layer of most stable quality. Moreover, the plating can be carried out at a current density in a range from 0.1 to 2.5 A/dm$^2$. Because quality of the nickel layer is less sensitive to current density than nickel acetate bath. The above description is based on condition that the plating bath is stirred.

In the manufacturing method of the surface-treated copper foil of the present invention, solution selected from widely used popular tin solutions can be used. For example, applying stannous sulfate with tin concentration of 2 to 15 g/L under conditions of solution temperature of 20 to 50° C., pH of 2 to 4 and current density of 0.3 to 10 A/dm$^2$ or else can be used. It is particularly preferable to prepare a plating solution containing $K_2SnO_3 \cdot 3H_2O$ in the concentration of 1 to 10 g/L (as tin) and $K_4P_2O_7$ in the concentration of 50 to 400 g/L as tin electrolytic solution under electrolysis conditions of solution temperature of 20 to 45° C., pH of 10 to 13 and current density of 0.1 to 2.0 A/dm$^2$. In particular, it is preferred for pH range of the tin plating solution to be under 11.5 to prevent generation of tin oxide sludge. In addition, generation of the hydrogen gas, which may also be affected by tin ion concentration in the tin plating solution, current density and solution temperature in the plating process, may be vigorous with solution pH of under 10.5 and it makes forming of a uniform plated layer difficult. Therefore, the pH is preferably controlled in a range from 10.5 to 11.5. It is preferable to apply the electrolysis conditions described above with the tin electrolytic solution composition to assure the tin layer of uniform thickness. So, without the above conditions with respect to solution composition and electrolysis conditions, uniform thickness in the tin layer may be lost.

In the manufacturing method of the surface-treated copper foil of the present invention, a silane coupling agent layer is preferably formed on the rust-proofing layer by the following procedure. The silane coupling agent is used after dissolving in water or an organic solvent as solvent at around room temperature to have a concentration of 1 to 10 g/L. As a silane coupling agent bond with OH on the rust-proofing layer by condensation reaction to be a layer, so increasing the concentration over a certain level will increase its effect little. With a concentration of under 1 g/L, adsorption might be slow to result little profit in a general commercial scale and also to be uneven. On the other hand, with a concentration of over 10 g/L, polymerization of the coupling agent may be proceed to result precipitate and deviation in properties. Therefore, it is more preferable to arrange the concentration of the silane coupling agent at 3 to 6 g/L, in order to assure an adequate adsorption rate and to prevent polymerization for the silane coupling agent at the same time.

After finishing the silane coupling agent adsorption on the rust-proofing layer, drying is performed at 160 to 200° C., preferably 170 to 185° C. in the manufacturing process of the surface-treated copper foil of the present invention. With atmosphere temperature of lower than 160° C. for drying, moisture may look to be removed. But condensation reaction within the adsorbed silane coupling agent and OH function on the rust-proofing layer may not be promoted. In addition, evaporation of the water generated in the condensation reaction may not be finished in a short time. With atmosphere temperature of over 200° C. for drying is also not preferable, because destruction or decomposition of the functional groups in the agent which bond with the resin constituting the substrate when the agent is bond with the substrate may occur. When destruction or decomposition of the functional groups which assist adhesion of the agent with substrate to each other will result poor adhesion between the copper foil and substrate, because it fails to maximize the effect brought by the adsorbed agent. The method for drying the agent can be a method using an electric heater or a wind blowing method blowing a hot wind. When a an electric heater is used, temperature of the copper foil itself may be elevated to higher temperature than the temperature of the wind blowing to the copper foil in a short time, so atmosphere temperature is preferable to strictly controlled and arranged.

It is preferable to keep drying in an atmosphere at 180 to 190° C. for 30 to 240 minutes over a concept not only just drying but also to result a baking effect. The baking is hereinafter referred to as "after-baking." The after-baking improves properties of the surface-treated copper foil of the present invention as a material for printed wiring boards and greatly stabilize adhesion to the resin substrate. The possible phenomenon considerable caused by the after-baking may be resulted by thermal diffusion between the layers, releasing of strain in the electroplated layer caused in electrodeposition or formation of some intermetallic compounds, or oxidation of the tin layer surface. The mechanisms responsible for improving properties of the surface-treated copper foil of the present invention as a material for printed wiring boards after-baking are not fully substantiated at present.

<Surface-Treated Copper Foil Coated with a Very Thin Primer Resin Layer of the Present Invention>

The surface-treated copper foil coated with a very thin primer resin layer of the present invention comprises the very thin primer resin layer having a thickness by calculation of 0.5 to 5-micron meter coated on the bonding side of the surface-treated copper foil of the present invention to the insulating resin substrate. The bonding side of the surface-treated copper foil may be so called both shiny side or matte side of the electrodeposited copper foil. It is particularly advantageous when the foil surface has no roughening treatment.

The surface-treated copper foil coated with a very thin primer resin layer of the present invention 1 has a schematic cross-sectional view illustrated in FIG. 1. In the FIG. 1, both the rust-proofing layer 3 and silane coupling agent layer 4 on the copper foil 2 are obviously described. However, the layer structure of the silane coupling agent layer 4, in particular, cannot be proved even with a transmission electron microscope in actual, so the structure model is shown to ease understanding of description hereinafter. Simple description on the surface-treated copper foil coated with a very thin primer resin layer of the present invention 1 is the surface-treated copper foil 5 without roughening treatment coated with a very thin resin layer. The very thin resin layer is referred to as "very thin primer resin layer 6" in the surface-treated copper foil coated with a very thin primer resin layer of the present invention.

By providing the very thin primer resin layer 6 having a thickness by calculation of 0.5 to 5-micron meter on the rust-proofing layer 3 and silane coupling agent layer 4 of the surface-treated copper foil of the present invention, good adhesion of the foil to a resin substrate can be assured even for the foil without roughening treatment on the surface-treated copper foil. In other words, adhesion of the surface treated copper foil to the resin substrate is much improved in the surface treated copper foil coated with the very thin primer resin layer when compared with the adhesion of the surface treated copper foil without surface-roughening treatment directly bonded to the resin substrate.

The very thin primer resin layer is very thin resin layer of a thickness by calculation of 0.5 to 5-micron meter. The thickness is applied to create a condition under which resin flow is substantially prevented during the hot pressing process for bonding the surface-treated copper foil coated with a very thin primer resin layer of the present invention to the resin substrate of prepreg or the like. In a conventional process for laminating a surface-treated copper foil to a resin substrate, air is held in irregularities on a matte side of the surface-treated copper foil, and a resin flow is intentionally caused to be a width of about 5 to 15 mm from edges of a copper clad laminate, 1 m² in size, for discharging air as one of the objective. On the other hand, for the surface-treated copper foil coated with a very thin primer resin layer of the present invention, prevention of resin flow is the most important function for securing the adhesion even for the surface-treated copper foil without roughening treatment to the resin substrate.

The resin flow is judged with value examined in accordance with the MIL Specification (MIL-P-13949G) in this specification. More specifically, four surface-treated copper foils coated with a very thin primer resin layer of the present invention in 10 cm square are sampled, and then stacked and pressed at 171° C. with 14 kg-f/cm² for 10 minutes. A resin flow is evaluated in accordance with the formula (I). A 40-micron meter thick resin layer is prepared for measurement of the resin flow in the specification, because sensitivity of measurement accuracy cannot be assured when the surface-treated copper foil coated with a very thin primer resin layer of the present invention is directly used for the examination. For reference, resin flows for a conventional pre-preg or conventional resin coated copper foil with a 40-micron meter thick resin layer are about 20%.

$$\text{Resin flow (\%)} = \frac{\text{Weight of outflowing resin}}{\text{(Weight of laminate)} - \text{(Weight of copper foil)}} \times 100$$

The very thin primer resin layer having a thickness under 0.5-micron meter may be difficult to uniformly coat the surface-treated copper foil, even when the foil surface looks to be smooth and irregularity-free. More preferably, minimum thickness of the very thin primary resin layer of 1-micron meter or more may made the coating on the surface treated copper foil more uniform. On the other hand, further increasing the thickness of over 5-micron meter improves its adhesion to the substrate or prepreg little, only consuming the resources wastefully. The thickness is an calculated value when the primer resin is coated on a unit area (1 m²) of ideal flat surface.

Next, the resin composition which constitutes the very thin primer resin layer is described. Simply speaking, the resin composition for the present invention comprises an epoxy resin, curing agent, solvent-soluble aromatic polyamide resin (or polyether sulfone) and, curing accelerator added in an appropriate amount as required.

The "epoxy resin" here is a compound having 2 or more epoxy functional groups in the molecular structure, and any one can be used without causing problems so long as it is useful for electric and/or electronic applications. The preferable epoxy resin for the present invention is one or combination of two or more selected from the group consisting of bisphenol A, bisphenol F, bisphenol S, novolac, cresol novolac, alicyclic, brominated, glycidyl amine type epoxy resins.

The epoxy resin is a main component (5 to 80 parts by weight) of the resin composition. It is incorporated with a curing agent, described below. The resin composition of the epoxy resin (including a curing agent) content of under 5 parts by weight may not fully perform its thermosetting capability to result poor performance as a binder and poor adhesion to the resin substrate. On the other hand, the resin solution with the composition of the epoxy resin content of over 80 parts by weight may be too viscous to cause difficulty in the coating uniformly on the foil surface, and it may not be sufficiently tough after being cured, because of out of balance with an aromatic polyamide resin or polyether sulfone described later.

The "curing agent" to be incorporated in the epoxy resin may be selected from amines, e.g., dicyandiamide, imidazoles and aromatic amines; phenols, e.g., bisphenol A and brominated bisphenol A; novolac s, e.g., phenol novolac resins and cresol novolac resins; and acid anhydrides, e.g., phthalic anhydride; or the like. Content of the curing agent in the epoxy resin is determined from the equivalent between them, and it will not be necessary to strictly specify, accordingly. This specification therefore will not limit the content.

Next, the "aromatic polyamide resin" is a product by reactions between an aromatic polyamide resin and rubber-like resin. Where the aromatic polyamide resin is synthesized by polycondensation between an aromatic diamine and dicarboxylic acid. The aromatic diamine is selected from 4,4-diaminodiphenyl methane, 3,3'-diaminodiphenyl sulfone, m-xylylene diamine, 3,3'-oxydianiline and so forth. The dicarboxylic acid is selected from phthalic acid, isophthalic acid, terephthalic acid and fumaric acids, and so forth.

The rubber-like resin to be reacted with the aromatic polyamide resin may be natural rubber or synthetic rubber. The latter synthetic rubber may be selected from styrene-butadiene rubber, butadiene rubber, butyl rubber and ethylene-propylene rubber, and so forth. To assure heat resistance of a dielectric layer to be formed, it is advantageous to select a synthetic rubber of heat resistance e.g., nitrile rubber, chloroprene rubber, silicon rubber or urethane rubber, and so forth. As the rubber-like resins to be reacted with the aromatic polyamide resin to form a copolymer, it is preferable to have some kind of functional groups at the terminal. It is particularly advantageous to use CTBN (butadiene nitrile with carboxyl structures at the terminal).

The aromatic polyamide resin is preferably blended in 25 to 75% by weight of the aromatic polyamide resin and the balance rubber-like resin. With aromatic polyamide resin content of under 25% by weight may result poor heat resistance, because of an excessive content of the rubber component. With over 75% by weight of aromatic polyamide resin, on the other hand, it may result an excessive hardness after being cured to be brittle, because of an excessive content of the aromatic polyamide resin. The aromatic polyamide resin is used to prevent damages of under-mining by an etchant, when the copper foil fabricated to the copper clad laminate is etched.

It is also preferable to use a polyether sulfone resin in place of the aromatic polyamide resin. It is particularly preferable to select a polyether sulfone resin which has a molecular structure with hydroxyl functional groups or amino functional groups at the terminal and is soluble in a solvent. It cannot react with an epoxy resin without hydroxyl functional groups or amino functional groups at the terminal, and may be difficult to control solid content unless it is soluble in a solvent. Use of the polyether sulfone resin can reduce moisture absorption of the insulation layer in a printed wiring board to reduce fluctuation of surface insulation resistance of the printed wiring boards.

The aromatic polyamide resin and polyether sulfone resin described above are primarily required to be soluble in a solvent. The aromatic polyamide resin and polyether sulfone resin is used in blending ratio of 20 to 95 parts by weight. More strictly, blending ratio of 20 to 80 parts by weight is preferable for the aromatic polyamide resin content and blending ratio of 50 to 95 parts by weight is preferable for the polyether sulfone resin. With blending ratio of aromatic polyamide resin or polyether sulfone resin under the lower limit, it may be excessively cured to result brittle under popular pressing conditions for manufacturing copper clad laminates, tending to cause micro cracks on the board surface. For the polyethersulfone resin used, preferable blending ratio is at 50 parts by weight or more, in order to reduce resin damages by a desmear treatment solution. Increasing the aromatic polyamide resin or polyether sulfone resin over the upper limit may not cause any problems, mechanical strength may increases little after curing, but tendency to occur blistering in the solder float test carried out at 260° C. come up. Therefore, the upper limit is set in consideration of economic efficiency.

The "curing accelerator added in an appropriate amount as required" is tertiary amine, imidazole, urea-based one or the like. Its content is not limited in this specification, because it can be freely selected by a manufacturer in consideration of conditions or the like for production of the copper clad laminates.

<Manufacturing Method of the Surface-Treated Copper Foil Coated with a Very Thin Primer Resin Layer>

Next, the manufacturing method of the surface-treated copper foil coated with a very thin primer resin layer will be described. The present invention apply the method in which a resin solution for forming the very thin primer resin layer is first prepared in Step a and Step b described below, followed by coating the resin solution on the face where silane coupling agent layer is formed on the copper foil in a thickness by calculation of 0.5 to 5-micron meter and dried to be a semi-cured state.

Preparation of the solution for forming the very thin primer resin layer will be described.

First in Step a, a resin composition as a mixture comprising 5 to 80 parts by weight of epoxy resin (including a curing agent), 20 to 95 parts by weight of a solvent-soluble aromatic polyamide resin or polyether sulfone and, a curing accelerator added in an appropriate amount as required is prepared. Description of the resin composition and blending ratio are described before and omitted to avoid duplication.

Next in Step b, the resin solution is prepared in the following manner. For preparation of the resin composition with the aromatic polyamide resin, methylethylketone, cyclopentanone or a mixture thereof as a solvent are used for dissolving to prepare a resin solution with resin content of 10 to 40% by weight. The above solvent is selected for the following reasons: it can be easily and efficiently removed by evaporation by heating in the press processing in production of the copper clad laminates, and the resulting evaporated gases can be easily treated. And the solution can be easily adjusted to have an optimum viscosity for coating on the surface-treated copper foil.

Another solvents, e.g., dimethyl formamide, dimethyl acetoamide or N-methylpyrrolidone and the like can be also used. However, it is most preferable at present to use a mixed solvent of methylethylketone and cyclopentanone in environmental view. The mixing ratio is not limited when used in mixture. However, cyclopentanone may inevitably mix into the aromatic polyamide resin because it is used for adjusting the varnish. In anticipation of the inevitable contamination with cyclopentanone, it is preferable to use methylethylketone as a co-solvent in consideration of removal speed by evaporation by the heating in the printed wiring board use.

On the other hand, for preparation of the resin composition with the polyether sulfone resin, another solvent, e.g., dimethyl formamide, dimethyl acetoamide or N-methyl pyrrolidone is used for dissolving, because it is hard to dissolve into methylethylketone or cyclopentanone. It is more preferable to use a mixture solvent comprising the above compounds to assure stability of the resin solution quality for longer periods. Another solvent may be used, so long as it can dissolve all of the resin components for the present invention.

Above-described solvent is used to prepare a binder resin solution with solid resin content of 10 to 40% by weight. The solid resin content range described above makes it possible to coat on the copper foil in the thickness with highest accuracy. The solid resin content of under 10% by weight may result too low viscosity to flow on the surface as soon as it is coated and may fail to assure uniform thickness. On the other hand, the solid resin content of over 40% by weight, the solution may be too viscous to result difficulty in forming a thin film on the copper foil.

The coating method is not limited for coating of the resin solution prepared as described above on the surface-treated copper foil with the silane coupling agent layer. However, it is preferable to use a so-called gravure coater which is advantageous for forming a thin film, with consideration of that the solution should be coated accurately to form a thin film having a thickness by calculation of 0.5 to 5-micron meter. Drying of the coating film on the surface-treated copper foil may be applied in accordance with characteristics of the resin solution to make it a semi-cured state under adequate heating conditions.

EXAMPLE 1

(Preparation of the Surface-Treated Copper Foil)

In Example 1, the surface-treated copper foil was prepared by performing roughening treatment followed by a rust-proofing treatment, and a silane coupling agent treatment on matte side (surface roughness Ra: 0.64-micron meter, Rzjis: 3.0-micron meter) of an 18-micron meter thick untreated electrodeposited copper foil (hereinafter simply referred to as "untreated foil"). Process in detail will be described step by step.

Cleaning Treatment:

The untreated foil was first washed with an acidic solution to clean surface by removing an oil and/or fat components and surface oxide layer. The solution used was dilute sulfuric acid with sulfuric acid concentration of 150 g/L with solution temperature of 30° C. and immersed for 30 seconds, followed by rinsing with water.

Roughening Treatment:

The untreated foil after finishing of cleaning was then cathode-polarized for electrolysis under burning plating conditions in a copper sulfate solution with sulfuric acid concentration of 150 g/L and copper concentration of 14 g/L with solution temperature of 25° C., and fine copper particles are deposited on the matte side after electrolysis with a current density of 30 A/dm$^2$ for 5 seconds.

Then, in order to prevent dropping off of the deposited fine copper particles from the surface, seal plating under even plating conditions with a copper sulfate solution containing sulfuric acid concentration of 90 g/L and copper concentration of 65 g/L with solution temperature of 45° C. and a current density of 20 A/dm$^2$ for 10 seconds was performed to finish a with roughening treated surface. The surface roughness after roughening treatment was Ra of 0.71-micron meter and Rzjis of 4.4-micron meter.

Rust-Proofing Treatment:

A nickel layer and tin layer in this order was formed on the surface after roughening treatment by using the electrolytic nickel solution and electrolytic tin solution, described below. Forming conditions for the nickel and tin layer were changed to prepare samples in Examples 1-1 to 1-8. The detailed preparation conditions for these samples are summarized in Table 1 for easy understanding. Thickness by weight of the nickel and tin layers formed on the surface with roughening treatment of each of the prepared samples were examined and results are shown in Table 2. The thickness by weight was determined by analyzing the solution in which a rust-proofing layer on the surface with roughening treatment of the surface-treated copper foil is dissolved by using inductively-coupled plasma emission spectrometry (ICP) and calculated.

The nickel layer was formed by electrolysis using an aqueous nickel electrolytic solution with $NiSO_4 \cdot 6H_2O$ of 2 g/L (as nickel) and $K_4P_2O_7$ concentration of 90 g/L. Electrolysis was carried out under the conditions of solution temperature of 40° C., pH of 10.5 and current density of 0.66 A/dm$^2$ for 1 to 4 seconds as electrolysis time with stirring, to deposit the layer to a thickness by weight shown in Table 2.

The tin layer was formed by electrolysis by using a tin electrolytic solution with $K_2SnO_3 \cdot 3H_2O$ concentration of 3 g/L (as tin) and $K_4P_2O_7$ concentration of 90 g/L. Electrolysis was carried out under the conditions of solution temperature of 35° C., pH of 11.0 and current density of 0.66 A/dm$^2$ for 1 to 4 seconds as electrolysis time with stirring, to deposit the layer to a thickness by weight shown in Table 2.

Treatment with a Silane Coupling Agent:

A silane coupling agent was adsorbed on the rust-proofing layer on the surface with roughening treatment. The solution composition used was prepared by adding gamma-glycidoxypropyl trimethoxysilane to de-ionized water as a solvent to have concentration of 5 g/L. And the adsorption treatment was performed by spraying the solution on the surface.

After finishing the silane coupling agent treatment, finished surface-treated copper foil was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

The after-baking treatment was carried out at 180° C. for 60 minutes in an oven to bake Samples 1-1, 1-3, 1-5 and 1-7 to prepare Samples 1-2, 1-4, 1-6 and 1-8.

Preparation of Circuit for Peel Strength Measurement:

The surface with roughening treatment of each of Samples 1-1 to 1-8 was laminated to a 150-micron meter thick FR-4-prepreg to prepare the copper clad laminate. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 1-1 to 1-8 are summarized in Table 3, which also show the results on the samples prepared in Comparative Examples to ease comparison. The measurement procedures for each measurement items will be described below.

The peel strength in this specification is the strength measured by peeling the copper foil circuit from the substrate at an angle of 90°, perpendicular to the substrate. The peel strength as received is the peel strength measured without any treatment after etching for the circuit formation. The peel strength after solder floating is the peel strength measured after floating the sample for 20 seconds on a solder bath at 246° C. and then cooled down to room temperature.

Resistance to peel loss after hydrochloric acid dipping shows degree of decreasing of the peel strength after dipping in the hydrochloric acid (conditions are shown in the tables: the specimen with the 0.2 mm wide circuit is dipped in a mixture [conc. hydrochloric acid]:[water] in 1:1 at room temperature for 60 minutes, and the specimen with the 0.8 mm wide circuit is dipped in a mixture [conc. hydrochloric acid]:[water] in 1:2 at room temperature for 30 minutes) in comparison with peel strength as received measured immediately after preparing a test circuit. It is calculated by the following formula:

[Peel loss after hydrochloric acid dipping(%)]=([Peel strength as received]−[Peel strength after hydrochloric acid dipping])/[Peel strength as received]×100

Resistance to peel loss after moisture absorption shows degree of decreasing of the peel strength after moisture absorption (conditions are shown in the tables: the specimen is boiled for 2 hours) in comparison with peel strength as received measured immediately after preparing a test circuit. It is calculated by the following formula:

[Peel loss after moisture absorption(%)]=([Peel strength as received]−[Peel strength after moisture absorption])/[Peel strength as received]×100

The sample having lower degree of the peel loss means that the surface-treated copper foil has excellent properties.

EXAMPLE 2

(Preparation of the Surface-Treated Copper Foil)

In Example 2, a surface-treated copper foil was prepared by performing a rust-proofing treatment followed by a silane coupling agent treatment on a shiny side (surface roughness Ra: 0.25-micron meter, Rzjis: 1.2-micron meter) of an 18-micron meter thick untreated electrodeposited copper foil (hereinafter simply referred to as "untreated foil"). It means that the surface-roughening treatment was omitted. The process will be described in detail step by step.

Cleaning Treatment:

The untreated foil was washed with an acidic solution for surface cleaning to remove an oil, fat component and surface oxide layer in the same manner as in Example 1.

Rust-Proofing Treatment:

The untreated copper foil itself was cathode-polarized after finishing of cleaning to form a nickel layer and a tin layer in this order on the shiny side with the same nickel and tin electrolytic solutions as in Example 1. Total 8 samples, Samples 2-1 to 2-8, were prepared under the same conditions for preparing a nickel layer and a tin layer as in Example 1 where Samples 1-1 to 1-8 were prepared. The detailed preparation conditions for these samples are also shown in Table 1. The thickness by weight of the nickel layers and the tin layers formed on the shiny side of each of the prepared samples were examined and are summarized in Table 4.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

In the after-baking treatment carried out at 180° C. for 60 minutes in an oven, Samples 2-1, 2-3, 2-5 and 2-7 were heated to prepare Samples 2-2, 2-4, 2-6 and 2-8.

Formation of Very Thin, Primer Resin Layer:

A resin solution for forming the very thin, primer resin layer was prepared. In this example, a resin solution containing an aromatic polyamide resin was prepared.

The raw materials for the resin solution used were an o-cresol novolac epoxy resin (YDCN-704 produced by Tohto Kasei Co., Ltd.) and solvent-soluble aromatic polyamide resin (BP3225-50P supplied as mixed varnish with cyclopentanone as a solvent produced by Nippon Kayaku Co., Ltd.). Obtained mixed varnish was mixed with a phenolic resin (VH-4170 produced by Dai-Nippon Ink & chemicals Co., Ltd.) as a curing agent and curing accelerator (2E4MZ produced by Shikoku Chemicals Co., Ltd.), to prepare the resin composition having the mixing ratio described below.

Resin Composition:

| | |
|---|---|
| O-cresol novolac epoxy resin | 38 parts by weight |
| Aromatic polyamide resin | 50 parts by weight |
| Phenolic resin | 18 parts by weight |
| Curing accelerator | 0.1 parts by weight |

The resin solution having a resin content adjusted at 30% by weight was prepared by dissolving the resin composition in methylethylketone. The resin solution prepared as above was coated on the silane coupling agent layer on the surface-treated copper foil (each of Samples 2-1 to 2-8) by using a gravure coater. It was then air-dried for 5 minutes and then dried in a heated atmosphere at 140° C. for 3 minutes to prepare the copper foil coated with a very thin primer resin layer of the present invention, having 1.5-micron meter thick very thin primer resin layer in a semi-cured state (Samples 1P to 8P).

A copper foil coated with a 40-micron meter thick primer resin layer was prepared for resin flow measurement (hereinafter referred to as resin flow measurement sample) Four specimens in 10 cm square were sampled from the resin flow measurement samples for resin flow examination in accordance with the MIL-P-13949G. Resin-flow was 1.5% with the above resin solution.

Preparation of Circuit for Peel Strength Measurement:

Copper clad laminate was prepared by laminating the 1.5-micron meter thick very thin primer resin layer in a semi-cured state, formed on each of Samples 1P to 8P, to a 150-micron meter thick FR-4 prepreg. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 1P to 8P are summarized in Table 5, which also presents the results on the samples prepared in Comparative Examples to ease comparison. The measurement procedures and the like for each measurement items are the same as in Example 1.

EXAMPLE 3

(Preparation of the Surface-Treated Copper Foil)

In Example 3, a surface-treated copper foil was prepared by performing a rust-proofing treatment followed by a silane coupling agent treatment on a shiny side (surface roughness Ra: 0.25-micron meter, Rzjis: 1.2-micron meter) of an 18-micron meter thick untreated electrodeposited copper foil (hereinafter simply referred to as "untreated foil"). It means that the surface-roughening treatment was omitted. The process will be described in detail step by step.

Cleaning Treatment:

The untreated foil was washed with an acidic solution for surface cleaning to remove an oil, fat component and surface oxide layer in the same manner as in Example 1.

Rust-Proofing Treatment:

The untreated copper foil itself was cathode-polarized after finishing of cleaning to form a nickel layer and a tin layer in this order on the shiny side with the same nickel and tin electrolytic solutions as in Example 1. A total of 4 samples, Samples 3-1 to 3-4, were prepared under the same conditions for preparing a nickel layer and a tin layer as in Example 1 where Samples 1-1 to 1-8 were prepared, except for electrolysis time. The detailed preparation conditions for these samples were shown in Table 1. The thickness by weight of the nickel layers and the tin layers formed on the shiny side of each of the prepared samples were examined and are summarized in Table 4.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

The after-baking treatment was carried out at 180° C. for 60 minutes in an oven to bake Samples 3-1 and 3-3 to prepare Samples 3-2 and 3-4.

Formation of Very Thin, Primer Resin Layer:

A resin solution for forming the very thin, primer resin layer was prepared. In this example, a resin solution containing a polyether sulfone resin was prepared.

The raw materials for the resin solution used were an epoxy resin (EPPN-502 produced by Nippon Kayaku Co., Ltd.) and polyether sulfone resin (Sumika Excel PES-5003P produced by Sumitomo-Chemical Co., Ltd.). Prepared mixed varnish was mixed with an imidazole-based curing accelerator (2P4 MHZ produced by Shikoku Chemicals Co., Ltd.), to prepare the second resin composition.

Second Resin Composition:

| Epoxy resin | 50 parts by weight |
| Polyether sulfone resin | 50 parts by weight |
| Curing accelerator | 1 part by weight |

The second resin solution having a resin content adjusted at 30% by weight was prepared by dissolving the resin composition in dimethyl formamide. The resin solution prepared as above was coated on the silane coupling agent layer on the surface-treated copper foil (each of Samples 3-1 to 3-4) by using a gravure coater. It was then air-dried for 5 minutes and then dried in a heated atmosphere at 140° C. for 3 minutes to prepare the copper foil coated with a very thin primer resin layer of the present invention, having a 1.5-micron meter thick very thin primer resin layer in a semi-cured state (Samples 9P to 12P).

A copper foil coated with a 40-micron meter thick primer resin layer was prepared for resin flow measurement (hereinafter referred to as resin flow measurement sample)

Four specimens in 10 cm square were sampled from the resin flow measurement samples for resin flow examination in accordance with the MIL-P-13949G. Resin flow was 1.4% with the above resin solution.

Preparation of Circuit for Peel Strength Measurement:

Copper clad laminate was prepared by laminating the 1.5-micron meter thick very thin primer resin layer in a semi-cured state, formed on each of Samples 9P to 12P, to a 150-micron meter thick FR-4 prepreg. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 9P to 12P are summarized in Table 5, which also presents the results on the samples prepared in Comparative Examples to ease comparison. The measurement procedures and the like for each measurement items are the same as in Example 1.

COMPARATIVE EXAMPLE 1

In Comparative Example 1, the surface-treated copper foil was prepared by performing roughening treatment followed by a rust-proofing treatment (just nickel layer) and a silane coupling agent treatment on matte side (surface roughness Ra: 0.64-micron meter, Rzjis: 3.0-micron meter) of an 18-micron meter thick untreated electrodeposited copper foil (hereinafter simply referred to as "untreated foil") same with that in Example 1.

Cleaning Treatment:

The untreated foil was washed with an acidic solution for surface cleaning to remove an oil, fat component and surface oxide layer in the same manner as in Example 1.

Roughening Treatment:

The roughening treatment was performed as in Example 1. The surface roughness of the roughening treated surface was Ra of 0.71-micron meter and Rzjis of 4.4-micron meter.

Rust-Proofing Treatment:

Just a nickel layer was formed on the surface of roughening treatment by using the same nickel electrolytic solution as in Example 1. The nickel layer forming condition is shown in Table 1. The thickness by weight of the nickel layers formed on the roughening treatment side of the prepared samples was examined and is summarized in Table 2.

Treatment with a Silane Coupling Agent:

A silane coupling agent was adsorbed on the rust-proofing layer on the roughening treatment. The conditions, e.g., treatment solution composition, was the same as that in Example 1. After finishing the silane coupling agent treatment, finished surface-treated copper foil (Sample 1-9) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

After-baking treatment was carried out at 180° C. for 60 minutes in an oven to bake Sample 1-9 to prepare Sample 1-10.

Preparation of Circuit for Peel Strength Measurement:

Copper clad laminates were prepared by laminating the surface with roughening treatment of each of Samples 1-9 and 1-10 to a 150-micron meter thick FR-4 prepreg. Straight circuit with a 10, 0.8 or 0.2 mm wide were formed in the same manner as in Example 1 to prepare the peel strength measurement sample.

Peel Strength Measurement Results:

Peel strength measurement results on Samples 1-9 and 1-10 are summarized in Table 3. The measurement procedures and the like for each measurement item are the same as in Example 1.

COMPARATIVE EXAMPLE 2

In Comparative Example 2, the surface-treated copper foil was prepared by performing roughening treatment followed by a rust-proofing treatment (just tin layer), and a silane coupling agent treatment on matte side (surface roughness Ra: 0.64-micron meter, Rzjis: 3.0-micron meter) of an 18-micron meter thick untreated electrodeposited copper foil (hereinafter simply referred to as "untreated foil") same with that in Example 1.

Cleaning Treatment:

The untreated foil was washed with an acidic solution for surface cleaning to remove an oil, fat component and surface oxide layer in the same manner as in Example 1.

Roughening Treatment:

The roughening treatment was performed in the same manner as in Example 1.

Rust-Proofing Treatment:

Just tin layer was formed on the surface with roughening treatment by using the same tin electrolytic solution as in Example 1. The tin layer forming conditions are shown in Table 1. The thickness by weight of the tin layer formed on the roughening treatment side of the prepared sample was examined and is summarized in Table 2.

Treatment with a Silane Coupling Agent:

A silane coupling agent was adsorbed on the rust-proofing layer on the roughening treatment. The conditions, e.g., treatment solution composition, were the same as those in Example 1. After finishing the silane coupling agent treatment, finished surface-treated copper foil (Sample 1-11) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

After-baking treatment was carried out at 180° C. for 60 minutes in an oven to bake Sample 1-11 to prepare Sample 1-12.

Preparation of Circuit for Peel Strength Measurement:

Copper clad laminates were prepared by laminating the surface with roughening treatment of each of Samples 1-11 and 1-12 to a 150-micron meter thick FR-4 prepreg. Straight circuit with a 10, 0.8 or 0.2 mm wide were formed in the same manner as in Example 1 to prepare the peel strength measurement sample.

Peel Strength Measurement Results:

Peel strength measurement results on Samples 1-11 and 1-12 are summarized in Table 3. The measurement procedures and the like for each measurement item are the same as in Example 1.

COMPARATIVE EXAMPLE 3

In Comparative Example 3, the surface-treated copper foil was prepared by performing roughening treatment followed by a rust-proofing treatment (tin-nickel alloy layer), and a silane coupling agent treatment on matte side (surface roughness Ra: 0.64-micron meter, Rzjis: 3.0-micron meter) of an 18-micron meter thick untreated electrodeposited copper foil (hereinafter simply referred to as "untreated foil") same with that in Example 1.

Cleaning Treatment:

The untreated foil was washed with an acidic solution for surface cleaning to remove an oil, fat component and surface oxide layer in the same manner as in Example 1.

Roughening Treatment:

The roughening treatment was performed in the same manner as in Example 1.

Rust-Proofing Treatment:

The nickel-tin alloy layer was formed on the surface with roughening treatment by using a nickel-tin alloy plating solution (composition: 3 g/L of nickel sulfate (as nickel), 2 g/L of stannous pyrophosphate (as tin) and 90 g/L of potassium pyrophosphate). Nickel-tin alloy layer forming conditions are shown in Table 1. The amount of nickel and tin on the roughening treatment side of each of the prepared samples are summarized in Table 2.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil (Sample 1-13) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

The after-baking treatment was carried out at 180° C. for 60 minutes in an oven to bake Sample 1-13 to prepare Sample 1-14.

Preparation of Circuit for Peel Strength Measurement:

The copper clad laminate prepared by laminating the surface with roughening treatment of each of Samples 1-13 and 1-14 to a 150-micron meter thick FR-4 prepreg. Straight circuit with a 10, 0.8 or 0.2 mm wide were formed in the same manner as in Example 1 to prepare the peel strength measurement sample.

Peel Strength Measurement Results:

Peel strength measurement results on Samples 1-13 and are summarized in Table 3. The measurement procedures and the like for each measurement item are the same as in Example 1.

COMPARATIVE EXAMPLE 4

In Comparative Example 4, the surface-treated copper foil was prepared by performing roughening treatment followed by a rust-proofing treatment which is nickel-molybdenum-cobalt alloy layer similar disclosed in the patent document 2, and a silane coupling agent treatment on matte side (surface roughness Ra: 0.64-micron meter, Rzjis: 3.0-micron meter) of an 18-micron meter thick untreated electrodeposited copper foil (hereinafter simply referred to as "untreated foil").

Cleaning Treatment:

The untreated foil was washed with an acidic solution for surface cleaning to remove an oil, fat component and surface oxide layer in the same manner as in Example 1.

Roughening Treatment:

The roughening treatment was performed in the same manner as in Example 1.

Rust-Proofing Treatment:

The nickel-molybdenum-cobalt alloy layer was formed on the surface with roughening treatment by dipping the copper foil in an aqueous solution with tri sodium citrate ($Na_3C_6H_5O_7 \cdot 2H_2O$) concentration of 30 g/L, nickel sulfate ($NiSO_4 \cdot 6H_2O$) concentration of 30 g/L, sodium molybdenate ($Na_2MoO_4 \cdot 2H_2O$) concentration of 3 g/L and cobalt sulfate ($CoSO_4 \cdot 7H_2O$) concentration of 7 g/L, followed by electrolysis under the conditions, pH of 6.0, bath temperature of 30° C., current density of 2 $A/dm^2$ and electrolysis time for 8 seconds without stirring. Forming conditions of the nickel-molybdenum-cobalt alloy layer is not shown in Table 1 because the condition is quite different from those applied in the above Examples and other Comparative Examples. The amount of nickel, molybdenum and cobalt on the roughening treatment of the prepared sample is summarized in Table 2.

Treatment with a Silane Coupling Agent:

A silane coupling agent was adsorbed on the rust-proofing layer of the shiny side. The conditions, e.g., treatment solution composition, was the same as those in Example 1. After finishing the silane coupling agent treatment, finished surface-treated copper foil (Sample 3) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

Sample with after-baking treatment was not prepared in Comparative Example 4.

Preparation of Circuit for Peel Strength Measurement:

The copper clad laminate was prepared by laminating the surface with roughening treatment of Sample 3 to a 150-micron meter thick FR-4 prepreg. Straight circuit with a 10, 0.8 or 0.2 mm wide were formed in the same manner as in Example 1 to prepare the peel strength measurement sample.

Peel Strength Measurement Results:

Peel strength measurement results on Sample 3 are summarized in Table 3. The measurement procedures and the like for each measurement item are the same as in Example 1.

COMPARATIVE EXAMPLE 5

In Comparative Example 5, the surface-treated copper foil was prepared by performing the rust-proofing treatment (just a nickel layer) followed by silane coupling agent treatment on the shiny side (surface roughness Ra: 0.25-micron meter, Rzjis: 1.2-micron meter) of an 18-micron meter thick untreated electrodeposited copper foil (hereinafter simply referred to as "untreated foil"). It is that the surface-roughening treatment was omitted. Detail will be described in step by step.

Cleaning Treatment:

The untreated foil was washed with an acidic solution for surface cleaning to remove an oil, fat component and surface oxide layer in the same manner as in Example 1.

Rust-Proofing Treatment:

The untreated copper foil after finishing cleaning was cathode-polarized to form just a nickel layer on the shiny side by using the same nickel electrolytic solution as in Example 1. The condition for forming nickel layer is shown in Table 1. The thickness by weight of the nickel layer formed on the shiny side of the prepared sample was examined and is summarized in Table 4.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil (Sample 2-9) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

After-baking treatment was carried out at 180° C. for 60 minutes in an oven to bake Sample 2-9 to prepare Sample 2-10.

Formation of Very Thin Primer Resin Layer:

A resin composition for forming the very thin primer resin layer was prepared in the same manner as in Example 2. The resin solution with solid resin content adjusted at 30% by weight is prepared by dissolving the resin composition in methylethylketone to result a resin flow characteristic similar to that in Example 2. The resin solution was coated on the silane coupling agent layer on the surface-treated copper foil (each of Samples 2-9 to 2-10) by using a gravure coater. It was then air-dried for 5 minutes and then dried in a heated atmosphere at 140° C. for 3 minutes to prepare the copper foil coated with a very thin primer resin layer of the present invention, having 1.5-micron meter thick very thin primer resin layer in a semi-cured state (Samples 13P and 14P)

Preparation of Circuit for Peel Strength Measurement:

Copper clad laminate was prepared by laminating the 1.5-micron meter thick very thin primer resin layer in a semi-cured state, formed on each of Samples 13P and 14P, to a 150-micron meter thick FR-4 prepreg. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 13P and 14P are summarized in Table 5 to ease comparison. The measurement procedures and the like for each measurement items are the same as in Example 1.

COMPARATIVE EXAMPLE 6

In Comparative Example 6, the surface-treated copper foil was prepared by performing a rust-proofing treatment (just a tin layer) followed by a silane coupling agent treatment on the shiny side (surface roughness Ra of 0.25-micron meter and Rzjis of 1.2-micron meter) of an 18-micron meter thick untreated electrodeposited copper foil (hereinafter simply referred to as "untreated foil"). It is that the surface-roughening treatment was omitted. Details will be described in step by step.

Cleaning Treatment:

The untreated foil was washed with an acidic solution for surface cleaning to remove an oil, fat component and surface oxide layer in the same manner as in Example 1.

Rust-Proofing Treatment:

The untreated copper foil after finishing cleaning was cathode-polarized to form just tin layer on the shiny side by using the same tin electrolytic solution as in Example 1. The thickness by weight of the tin layer formed on the shiny side of the prepared sample was examined and is summarized in Table 4.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil (Sample 2-11) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

The after-baking treatment was carried out at 180° C. for 60 minutes in an oven to bake Sample 2-11 to prepare Sample 2-12.

Formation of very thin primer resin layer:

A resin composition for forming the very thin primer resin layer was prepared in the same manner as in Example 2 . The resin solution with solid resin content adjusted at 30% by weight is prepared by dissolving the resin composition in methylethylketone to result a resin flow characteristic similar to that in Example 2. The resin solution was coated on the silane coupling agent layer on the surface-treated copper foil (each of Samples 2-11 and 2-12) by using a gravure coater. It was then air-dried for 5 minutes and then dried in a heated atmosphere at 140° C. for 3 minutes to prepare the copper foil coated with a very thin primer resin layer of the present invention, having 1.5-micron meter thick very thin primer resin layer in a semi-cured state (Samples 15P and 16P).

Preparation of Circuit for Peel Strength Measurement:

Copper clad laminate was prepared by laminating the 1.5-micron meter thick very thin primer resin layer in a semi-cured state, formed on each of Samples 15P and 16P, to a 150-micron meter thick FR-4 prepreg. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 15P and 16P are summarized in Table 5 to ease comparison. The measurement procedures and the like for each measurement items are the same as in Example 1.

COMPARATIVE EXAMPLE 7

In Comparative Example 7, a surface-treated copper foil was prepared by performing a rust-proofing treatment (nickel-tin alloy layer) followed by a silane coupling agent treatment on a shiny side (surface roughness Ra: 0.25-micron meter, Rzjis: 1.2-micron meter) of an 18-micron meter thick untreated electrodeposited copper foil (hereinafter simply referred to as "untreated foil"). Detail will be described in step by step.

Cleaning Treatment:

The untreated foil was washed with an acidic solution for surface cleaning to remove an oil, fat component and surface oxide layer in the same manner as in Example 1.

Rust-Proofing Treatment:

The untreated copper foil after finishing cleaning was cathode-polarized to form the nickel-tin alloy layer on the shiny side by using the same nickel-tin alloy plating solution as in Comparative Example 3. The nickel-tin alloy layer forming conditions are shown in Table 1. Amount of the nickel and tin on the shiny side of the prepared sample are summarized in Table 2.

Treatment with a Silane Coupling Agent:

A silane coupling agent was adsorbed on the rust-proofing layer of the shiny side. The conditions, e.g., treatment solution composition, were the same as those in Example 1. After finishing the silane coupling agent treatment, finished surface-treated copper foil (Sample 2-13) was obtained by passing through an electric heated oven in 4 seconds, where the oven atmosphere was controlled in such a way that the foil temperature will finally reach at 140° C. to remove moisture and accelerate condensation of the silane coupling agent.

After-Baking Treatment:

The after-baking treatment was carried out at 180° C. for 60 minutes in an oven to bake Sample 2-13 to prepare Sample 2-14.

Formation of very thin primer resin layer:

A resin composition for forming the very thin primer resin layer was prepared in the same manner as in Example 2. The resin solution with solid resin content adjusted at 30% by weight is prepared by dissolving the resin composition in methylethylketone to result a resin flow characteristic similar to that in Example 2. The resin solution was coated on the silane coupling agent layer on the surface-treated copper foil (each of Samples 2-13 and 2-14) by using a gravure coater. It was then air-dried for 5 minutes and then dried in a heated atmosphere at 140° C. for 3 minutes to prepare the copper foil coated with a very thin primer resin layer of the present invention, having 1.5-micron meter thick very thin primer resin layer in a semi-cured state (Samples 17P and 18P).

Preparation of Circuit for Peel Strength Measurement:

Copper clad laminate was prepared by laminating the 1.5-micron meter thick very thin primer resin layer in a semi-cured state, formed on each of Samples 17P and 18P, to a 150-micron meter thick FR-4 prepreg. Dry-film as etching resist was laminated on the surface-treated copper foil on the copper-clad laminate followed by exposure of circuit pattern for examination and then developed. Then etching was performed by using cupric sulfate base etching solution to prepare the test specimens with 10, 0.8 or 0.2 mm wide straight circuit for peel strength measurement.

Peel Strength Measurement Results:

Peel strength measurement results on Samples 17P and 18P are summarized in Table 5 to ease comparison. The measurement procedures and the like for each measurement items are the same as in Example 1.

Comparison between Examples and Comparative Examples will be described. Conditions for preparation for each samples are summarized in Table 1.

TABLE 1

| | Sample names | | | | |
|---|---|---|---|---|---|
| | With surface roughening treatment | Without surface roughening treatment | Type of the rust-proofing layer | After-baking 180° C. × 1 h | Electrolysis conditions Concentration of the metallic components, Current density, Bath temperature and Electrolysis time |
| Example 1 and Example 2 | Sample 1-1 | Sample 2-1 | Ni layer/ Sn layer | None | Ni: 2 g/L, 0.66 A/dm$^2$, 40° C., 4 sec. |
| | Sample 1-2 | Sample 2-2 | | Done | Sn: 3 g/L, 0.66 A/dm$^2$, 35° C., 4 sec. |
| | Sample 1-3 | Sample 2-3 | | None | Ni: 2 g/L, 0.66 A/dm$^2$, 40° C., 2 sec. |
| | Sample 1-4 | Sample 2-4 | | Done | Sn: 3 g/L, 0.66 A/dm$^2$, 35° C., 2 sec. |
| | Sample 1-5 | Sample 2-5 | | None | Ni: 2 g/L, 0.66 A/dm$^2$, 40° C., 2 sec. |
| | Sample 1-6 | Sample 2-6 | | Done | Sn: 3 g/L, 0.66 A/dm$^2$, 35° C., 4 sec. |
| | Sample 1-7 | Sample 2-7 | | None | Ni: 2 g/L, 0.66 A/dm$^2$, 40° C., 4 sec. |
| | Sample 1-8 | Sample 2-8 | | Done | Sn: 3 g/L, 0.66 A/dm$^2$, 35° C., 2 sec. |
| Example 3 | — | Sample 3-1 | | None | Ni: 2 g/L, 0.66 A/dm$^2$, 40° C., 6 sec. |
| | | Sample 3-2 | | Done | Sn: 3 g/L, 0.66 A/dm$^2$, 35° C., 2 sec. |
| | | Sample 3-3 | | None | Ni: 2 g/L, 0.66 A/dm$^2$, 40° C., 2 sec. |
| | | Sample 3-4 | | Done | Sn: 3 g/L, 0.66 A/dm$^2$, 35° C., 6 sec. |
| Comparative Example 1 and Comparative Example 5 | Sample 1-9 Sample 1-10 | Sample 2-9 Sample 2-10 | Ni | None Done | Ni: 2 g/L, 0.66 A/dm$^2$, 40° C., 4 sec. |

TABLE 1-continued

| | Sample names | | | | |
|---|---|---|---|---|---|
| | With surface roughening treatment | Without surface roughening treatment | Type of the rust-proofing layer | After-baking 180° C. × 1 h | Electrolysis conditions Concentration of the metallic components, Current density, Bath temperature and Electrolysis time |
| Comparative Example 2 and Comparative Example 6 | Sample 1-11 Sample 1-12 | Sample 2-11 Sample 2-12 | Sn | None Done | Sn: 3 g/L, 0.66 A/dm², 35° C., 4 sec. |
| Comparative Example 3 and Comparative Example 7 | Sample 1-13 Sample 1-14 | Sample 2-13 Sample 2-14 | Ni—Sn alloy | None Done | Ni 3 g/L, Sn 2 g/L, 0.66 A/dm², 43° C., 10 sec. |
| Comparative Example 4 | | Sample 3 | Ni—Mo—CO alloy | None | Described in the specification |

Example 1: The matte side of the electrodeposited copper foil is roughened and then rust-proofing-treated.
Example 2: The shiny side of the electrodeposited copper foil is rust-proofing-treated, without roughening treatment.

Comparison between Examples and Comparative Examples

Comparison between Example 1 and Comparative Examples 1 to 4

First, thickness by weight of the rust-proofing element of each sample prepared in Example 1 (Samples 1-1 to 1-8) and that of each sample prepared in Comparative Examples 1 to 4 (Samples 1-9 to 1-14 and 3) in Table 2. The evaluation results on the samples are shown in Table 3.

TABLE 2

| | Samples | Type of the rust-proofing layer | Thickness by weight | |
|---|---|---|---|---|
| | | | Ni mg/m² | Sn mg/m² |
| Example 1 | Sample 1-1 Sample 1-2 | Ni layer/ Sn layer | 24 | 26.6 |
| | Sample 1-3 Sample 1-4 | | 12.7 | 14.9 |
| | Sample 1-5 Sample 1-6 | | 12 | 28.1 |
| | Sample 1-7 Sample 1-8 | | 22.3 | 15.1 |
| Comparative Example 1 | Sample 1-9 Sample 1-10 | Ni | 22.3 | — |
| Comparative Example 2 | Sample 1-11 Sample 1-12 | Sn | — | 34.3 |
| Comparative Example 3 | Sample 1-13 Sample 1-14 | Ni—Sn alloy | 14 | 22.1 |
| Comparative Example 4 | Sample 3 | Ni—Mo—CO alloy | Ni: 49/Mo: 29/Co: 27 | |

TABLE 3

| | Samples | Type of the rust-proofing layer | After-baking 180° C. × 1 h | Evaluation of adhesion (peel strength of the copper foil laminated on the FR-4 substrate) | | | | |
|---|---|---|---|---|---|---|---|---|
| | | | | Peel strength as received (circuit width: 10 mm) | Peel strength after solder floating (circuit width: 10 mm) | Resistance to peel loss after hydrochloric acid dipping (circuit width: 0.8 mm) | Resistance to peel loss after hydrochloric acid dipping (circuit width: 0.2 mm) | Resistance to peel loss after moisture absorption (circuit width: 0.8 mm) |
| | | | | kgf/cm | | | % | |
| Example 1 | Sample 1-1 | Ni layer/ Sn layer | None | 1.28 | 1.25 | 0.0 | 3.2 | 8.3 |
| | Sample 1-2 | | Done | 1.21 | 1.18 | 0.0 | 2.9 | 7.2 |
| | Sample 1-3 | | None | 1.21 | 1.18 | 0.0 | 0.6 | 5.0 |
| | Sample 1-4 | | Done | 1.19 | 1.17 | 0.0 | 0.0 | 0.0 |
| | Sample 1-5 | | None | 1.24 | 1.20 | 2.0 | 6.2 | 11.7 |
| | Sample 1-6 | | Done | 1.16 | 1.15 | 0.9 | 5.6 | 3.1 |
| | Sample 1-7 | | None | 1.22 | 1.18 | 1.3 | 0.6 | 6.1 |
| | Sample 1-8 | | Done | 1.16 | 1.14 | 0.8 | 6.8 | 5.3 |
| Comparative Example 1 | Sample 1-9 | Ni | None | 0.94 | 0.81 | 0.0 | 12.0 | 43.3 |
| | Sample 1-10 | | Done | 1.18 | 1.15 | 0.0 | 5.0 | 2.0 |
| Comparative Example 2 | Sample 1-11 | Sn | None | 1.16 | 1.11 | 0.0 | 0.0 | 1.6 |
| | Sample 1-12 | | Done | 1.13 | 1.09 | 0.0 | 2.8 | 7.6 |
| Comparative Example 3 | Sample 1-13 | Ni—Sn alloy | None | 1.18 | 1.12 | 0.0 | 3.2 | 18.9 |
| | Sample 1-14 | | Done | 1.18 | 1.14 | 4.3 | 1.6 | 0.0 |
| Comparative Example 4 | Sample 3 | Ni—Mo—Co alloy | None | 1.10 | 1.08 | 5.4 | 11.8 | 70.3 |

First, review the results on Comparative Examples 1 to 4. Sample 1-9 prepared in Comparative Example 1 is a sample in which just a nickel layer is formed as an rust-proofing layer without after-baking. The sample is inferior to the other samples in peel strength in the 10 mm wide circuit both as received and after solder floating. And as there is found big difference between resistance to peel loss after hydrochloric acid dipping between 0.8 mm wide circuit and the 0.2 mm wide circuit, so deviation in the resistance to peel loss after hydrochloric acid dipping might be big. Moreover, as it has a very poor resistance to peel loss after moisture absorption at 43.3%, properties after processing in a wet etching may deteriorate and it is unsuitable for services under a high humid atmosphere. On the other hand, Sample 1-10 which is after-baked Sample 1-9 is improved in all of the properties examined, including peel strength as received and after solder floating. The similar tendency are observed between Samples 1-13 and 1-14, prepared to have the rust-proofing layer of nickel-tin alloy layer in Comparative Example 3.

In contrast, just tin layer is formed on the samples as the rust-proofing layer in Comparative Example 2, and Sample 1-11 is without after-baking and Sample 1-12 is after-baked Sample 1-11. In this case, after-baked Sample 1-12 is inferior to Sample 1-11 in resistances to peel loss after both hydrochloric acid dipping and moisture absorption. In other words, the sample without after-baking performs more stable properties. Such tendency may come clear with increase of a heating energy. So, it should be considered that deterioration of the properties may caused by diffusion of tin into the bulk layer of the copper foil under heating during the after-baking treatment. However, it should be clearly noted that all of the samples prepared in Comparative Examples 1 to 3 have sufficient properties required for printed wiring boards, except peel loss after moisture absorption in Sample 1-9. It is however noted that the deviation in the properties of the samples prepared in Comparative Examples 1 and 2 (Samples 1-9 to 1-12) may increase with production lot increasing. It is also noted that for the plated nickel-tin alloy layer in each of samples prepared in Comparative Example 3 (Samples 1-13 and 1-14), it is difficult to control the deposited metal layer composition even with any efforts, which may results increasing of costs in the production and the administration. In other words, even each sample prepared in Comparative Examples 1 to 3 have an advantage of being free of chromium, but it lacks stability in production when plenty of the products with stable quality should be delivered.

In the sample prepared in Comparative Example 4, a nickel-molybdenum-cobalt alloy layer is formed as a rust-proofing layer and Sample 3 is without after-baking. Peel strength both as received and after solder floating in Sample 3 is not poor much to the other samples. However, the resistance to peel loss after hydrochloric acid dipping in both 0.8 wide and 0.2 mm wide circuits looks to be slightly inferior to that of Comparative Examples 1 to 3. It is particular in that resistance to peel loss after moisture absorption is outstandingly poor at 70.3%. Therefore, it is afraid of that occurrence of the circuit peel off by the impact, e.g., crushing in the handling of the printed wiring board production process, because the production process for printed wiring boards uses many solutions.

With understanding of the above descriptions, in Samples 1-1 to 1-8 prepared in Example 1, each of the samples show very good properties in any of peel strength both as received and after solder floating with the 10 mm wide circuit, resistance to peel loss after hydrochloric acid dipping with the 0.8 mm wide circuit, resistances to peel loss after both hydrochloric acid dipping with the 0.2 mm wide circuit and resistance to peel loss after moisture absorption. These properties are as well or better than those in any sample prepared in Comparative Examples. Also Example 1 results improved properties with after-baking. It can be understood from performances in Samples 1-1 to 1-8 that properties of the products are stable, total performance is well balanced, even applying a chromium-free rust-proofing layer. Moreover, as a nickel layer and tin layer are separately formed, process management might be simplified and suffered managements required in nickel-tin alloy plating may not be required.

Comparison between Examples 2 and 3 and Comparative Examples 5 to 7

Table 4 shows thickness by weight of the rust-proofing element in each sample prepared in Example 2 (Samples 2-1 to 2-8), Example 3 (Samples 3-1 to 3-4), and Comparative Examples 5 to 7 (Samples 2-9 to 2-14). Table 5 shows the examination results on copper foils coated with a very thin primer resin layer obtained from Samples 1P to 18P.

TABLE 4

| | Samples | Type of the rust-proofing layer | Thickness by weight Ni mg/m$^2$ | Sn mg/m$^2$ |
|---|---|---|---|---|
| Example 2 | Sample 2-1 → Sample 1P | Ni layer/ Sn layer | 20.1 | 23.5 |
| | Sample 2-2 → Sample 2P | | | |
| | Sample 2-3 → Sample 3P | | 10.4 | 12.7 |
| | Sample 2-4 → Sample 4P | | | |
| | Sample 2-5 → Sample 5P | | 10.1 | 23.3 |
| | Sample 2-6 → Sample 6P | | | |
| | Sample 2-7 → Sample 7P | | 19.8 | 11.8 |
| | Sample 2-8 → Sample 8P | | | |
| Example 3 | Sample 3-1 → Sample 9P | | 31.0 | 12.0 |
| | Sample 3-2 → Sample 10P | | | |
| | Sample 3-3 → Sample 11P | | 11.3 | 29.5 |
| | Sample 3-4 → Sample 12P | | | |
| Comparative Example 5 | Sample 2-9 → Sample 13P | Ni | 21.5 | — |
| | Sample 2-10 → Sample 14P | | | |
| Comparative Example 6 | Sample 2-11 → Sample 15P | Sn | — | 30.6 |
| | Sample 2-12 → Sample 16P | | | |
| Comparative Example 7 | Sample 2-13 → Sample 17P | Ni—Sn alloy | 12 | 20.4 |
| | Sample 2-14 → Sample 18P | | | |

TABLE 5

| | Samples | Type of the rust-proofing layer | After-baking 180° C. × 1 h | With or without very thin primer resin layer | Evaluation of adhesion (peel strength of the copper foil bonded to the FR-4 substrate) | | | | |
|---|---|---|---|---|---|---|---|---|---|
| | | | | | Peel strength as received (circuit width: 10 mm) Kgf/cm | Peel strength after solder floating (circuit width: 10 mm) | Resistance to peel loss after hydrochloric acid dipping (circuit width: 0.8 mm) | Resistance to peel loss after hydrochloric acid dipping (circuit width: 0.2 mm) % | Resistance to peel loss after moisture absorption (circuit width: 0.8 mm) |
| Example 2 | Sample 1P | Ni layer/ Sn layer | None | with | 1.18 | 1.16 | 4.2 | 10.2 | 13.4 |
| | Sample 2P | | Done | | 1.20 | 1.19 | 2.7 | 6.7 | 4.9 |
| | Sample 3P | | None | | 1.21 | 1.18 | 4.3 | 11.6 | 11.1 |
| | Sample 4P | | Done | | 1.20 | 1.19 | 2.3 | 7.8 | 2.3 |
| | Sample 5P | | None | | 1.22 | 1.18 | 4.2 | 12.8 | 13.2 |
| | Sample 6P | | Done | | 1.21 | 1.19 | 3.5 | 9.5 | 7.3 |
| | Sample 7P | | None | | 1.17 | 1.15 | 4.8 | 10.8 | 14.3 |
| | Sample 8P | | Done | | 1.18 | 1.16 | 3.8 | 8.2 | 8.6 |
| Example 3 | Sample 9P | | None | | 1.25 | 1.24 | 5.6 | 7.5 | 9.4 |
| | Sample 10P | | Done | | 1.23 | 1.22 | 2.9 | 5.1 | 7.2 |
| | Sample 11P | | None | | 1.31 | 1.30 | 0.6 | 5.0 | 7.3 |
| | Sample 12P | | Done | | 1.28 | 1.28 | 0.0 | 3.6 | 1.2 |
| Comparative Example 5 | Sample 13P | N | None | | 0.49 | 0.46 | 12.1 | 35.9 | 47.1 |
| | Sample 14P | | Done | | 1.12 | 1.10 | 0.8 | 13.6 | 33.3 |
| Comparative Example 6 | Sample 15P | Sn | None | | 1.17 | 1.16 | 2.3 | 0.7 | 15.8 |
| | Sample 16P | | Done | | 0.97 | 0.95 | 11.2 | 43.3 | 42.1 |
| Comparative Example 7 | Sample 17P | Ni—Sn alloy | None | | 1.19 | 1.17 | 5.7 | 8.4 | 13.6 |
| | Sample 18P | | Done | | 1.20 | 1.19 | 5.1 | 6.7 | 12.8 |

First, review the results of Comparative Examples 5 to 7 first. Similar results are obtained in Samples 2-9 to 2-14 of Comparative Examples 5 to 7 coated with the very thin primer resin layer (Samples 13P to 18P) as described before. Sample 2-9 (Sample 13P) prepared in Comparative Example 5 in which just a nickel layer is formed as the rust-proofing layer is without after-baking. Sample 2-9 has inferior properties to the other samples in peel strength both as received and after solder floating with the 10 mm wide circuit. It is understood that the resistance to peel loss after hydrochloric acid dipping may easily deviate because difference in resistance to peel loss after hydrochloric acid dipping between the 0.8 mm wide circuit and the 0.2 mm wide circuit is big, although they are tested under different conditions. Moreover, as it has a very poor resistance to peel loss after moisture absorption at 47.1%, properties after processing in a wet etching may be deteriorated and it is unsuitable for services under a high humid atmosphere. On the other hand, Sample 14P which is the copper foil coated with very thin primer resin layer obtained by using Sample 2-10 which is after-baked Sample 2-9 is improved in all of the properties examined, including peel strength as received and after solder floating. The similar tendency are observed in Samples 17P and 18P, prepared to have the rust-proofing layer of nickel-tin alloy layer in Comparative Example 7.

On the other hand, in Comparative Example 6, the samples are prepared by forming just tin layer as rust-proofing layer, where Sample 2-11 is without after-baking and Sample 15P is the copper foil coated with very thin primer resin layer obtained by using Sample 2-11. And Sample 2-12 is after-baked Sample 2-11, and Sample 16P is the copper foil coated with very thin primer resin layer obtained by using Sample 2-12. In this case, after-baked Sample 16P is inferior to Sample 15P in resistances to peel loss after both hydrochloric acid dipping and moisture absorption. The relationship is same as the case in Example 2. However, it should be clearly noted that all of the samples prepared in Comparative Examples 5 to 7 have sufficient properties required for printed wiring boards when examined as copper foil without roughening treatment. It is however noted that the deviation in the properties of the samples prepared in Comparative Examples 5 and 6 (Samples 13P to 16P) may increase with production lot increasing. It is also noted that for the plated nickel-tin alloy layer in each of samples prepared in Comparative Example 7 (Samples 17P and 18P), it is difficult to control the deposited metal layer composition even with any efforts, which may results increasing of costs in the production and the administration. In other words, even each sample prepared in Comparative Examples 1 to 3 have an advantage of being free of chromium, but it lacks stability in production when plenty of the products with stable quality should be delivered.

With understanding of the above descriptions, in both Samples 2-1 to 2-8 prepared in Example 2 and Samples 3-1 to 3-4 coated with very thin primer resin layer prepared in Example 3, each of the samples show very good properties in any of peel strength both as received and after solder floating in the 10 mm wide circuit, resistance to peel loss after hydrochloric acid dipping in the 0.8 mm wide circuit, and resistances to peel loss after both hydrochloric acid dipping in the 0.2 mm wide circuit and resistances to peel loss after moisture absorption. These properties are as well or better than those in any sample prepared in Comparative Examples 5 to 7. Also Examples 2 and 3 result improved properties with after-baking. It can be understood from performances in Samples 1P to 12P that properties of the products are stable, total performance is well balanced, even applying a chromium-free rust-roofing layer. Moreover, copper foils coated with very thin primer resin layer, Samples 1P to 12P in Example 2 and Example 3, are prepared by using Samples 2-1 to 2-8 and Samples 3-1 to 3-4 in which nickel layer and tin layer are separately formed, process management might be simplified and suffered managements required in nickel-tin alloy plating may not be required.

With understanding of the above descriptions, in both Samples 2-1 to 2-14 prepared in Example 2 and Samples 3-1 to 3-4 coated with very thin primer resin layer prepared in Example 3, each of the samples show very good properties in any of peel strength both as received and after solder floating in the 10 mm wide circuit, resistance to peel loss after hydrochloric acid dipping in the 0.8 mm wide circuit, and resistances to peel loss after both hydrochloric acid dipping in the 0.2 mm wide circuit and resistances to peel loss after moisture absorption. These properties are as well or better than those in any sample prepared in Comparative Examples 5 to 7. Also Examples 2 and 3 result improved properties with after-baking. It can be understood from performances in Samples 1P to 12P that properties of the products are stable, total performance is well balanced, even applying a chromium-free rust-proofing layer. Moreover, copper foils coated with very thin primer resin layer, Samples 1P to 12P in Example 2 and Example 3, are prepared by using Samples 2-1 to 2-14 and Samples 3-1 to 3-4 in which nickel layer and tin layer are separately formed, process management might be simplified and suffered managements required in nickel-tin alloy plating may not be required.

Industrial Applicability

The surface-treated copper foil of the present invention has state with a chromium (including chromate)-free rust-proofing layer composed of a nickel layer and a tin layer stacked in this order. The amount of the rust-proofing layer is in a range suitable for production of conventional printed wiring boards, so the production process require no special facilities nor process. Therefore, even when nickel and tin as the rust-proofing elements present on the foil, it can be removed by a conventional copper etchant. Moreover, the surface-treated copper foil of the present invention comprises a rust-proofing layer on the electrode posited copper foil which satisfy primary requirements after being processed into a printed wiring board, for example, circuit peel strength, resistance to peel loss after chemical treatment, resistance to peel loss after moisture absorption and heat resistance, and excellent in quality stability.

Moreover, the rust-proofing layer on the surface-treated copper foil of the present invention shows good adhesion to a substrate when coated with a very thin primer resin layer, even without roughening treatment to create an anchoring effect on the substrate.

The invention claimed is:

1. A chromate-free surface-treated copper foil comprising:
an electrodeposited copper foil;
a rust-proofing treatment layer comprising:
  a non-alloyed nickel layer on top and in direct contact with the electrodeposited copper foil; and
  a non-alloyed tin layer on top and in direct contact with the nickel layer; and
a silane coupling agent layer on top of and in direct contact with the tin layer, wherein the nickel layer has a thickness by weight of 5 to 40 mg/m$^2$ and the tin layer has a thickness by weight of 5 to 40 mg/m$^2$,
wherein the sum of thickness by weight of non-alloyed nickel and non-alloyed tin layers is 10 to 50 mg/m$^2$, and
wherein the non-alloyed nickel and non-alloyed tin layers combined have a [nickel weight/tin weight]ratio of 1/3 to 3.

2. A chromate-free surface-treated copper foil comprising:
an electrodeposited copper foil;
a non-alloyed nickel layer on top and in direct contact with the electrodeposited copper foil;
a non-alloyed tin layer on top and in direct contact with the nickel layer; and
a silane coupling agent layer on top of and in direct contact with the tin layer, wherein the nickel layer has a thickness by weight of 5 to 40 mg/m$^2$ and the tin layer has a thickness by weight of 5 to 40 mg/m$^2$,
wherein the sum of thickness by weight of non-alloyed nickel and non-alloyed tin layers is 10 to 50 mg/m$^2$, and
wherein the non-alloyed nickel and non-alloyed tin layers combined have a [nickel weight/tin weight]ratio of 1/3 to 3.

3. The surface-treated copper foil according to claim 2, wherein a copper surface of the electrodeposited copper foil comprises a roughening treatment.

4. The surface-treated copper foil according to claim 2, wherein the silane coupling agent is at least one of an amino-functional silane coupling agent and/or an epoxy-functional silane coupling agent.

5. The surface-treated copper foil according to claim 2, comprising a very thin primer resin layer having a thickness by calculation of 0.5 to 5-micron meter on the silane-coupling agent layer.

6. The surface-treated copper foil according to claim 5, wherein the very thin primer resin layer is composed of a resin composition comprising 5 to 80 parts by weight of an epoxy resin which includes a curing agent, 20 to 95 parts by weight of a solvent-soluble aromatic polyamide resin or polyether sulfone and, as required, a curing accelerator added in an appropriate amount.

7. The surface-treated copper foil according to claim 6, wherein the solvent-soluble aromatic polyamide resin is prepared by reacting an aromatic polyamide with a rubber-like resin.

8. The surface-treated copper foil according to claim 5, wherein the very thin primer resin layer has a resin flow of 5% or less, examined in accordance with the MIL standard (MIL-P-13949G).

9. A manufacturing method of the surface-treated copper foil coated with a very thin primer resin layer according to claim 5, comprising: preparing the resin solution according to the procedure of Step a followed by Step b; coating the resin solution on the surface of the copper foil on which the silane coupling agent layer is formed to form the very thin primer resin layer to be a thickness by calculation of 0.5 to 5-micron meter; and drying the resin solution to be a semi-cured state, wherein
Step a comprises: preparing a resin composition as a mixture comprising 5 to 80 parts by weight of an epoxy resin (including a curing agent), 20 to 95 parts by weight of a solvent-soluble aromatic polyamide resin or polyether sulfone and, as required, a curing accelerator added in an appropriate amount; and wherein
Step b comprises: dissolving the resin composition in an organic solvent to prepare a resin solution with solid resin content of 10 to 40% by weight.

* * * * *